(12) United States Patent
Okitaka

(10) Patent No.: US 6,577,979 B1
(45) Date of Patent: Jun. 10, 2003

(54) SEMICONDUCTOR INTEGRATED CIRCUIT WITH IP TEST CIRCUIT

(75) Inventor: Takenori Okitaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/414,036

(22) Filed: Oct. 7, 1999

(30) Foreign Application Priority Data

Apr. 26, 1999 (JP) .......................................... 11-118603

(51) Int. Cl.$^7$ .............................................. G01R 27/28
(52) U.S. Cl. ...................... 702/117; 702/117; 702/118; 702/120; 702/122; 702/189; 714/733; 714/734; 714/738; 438/18; 324/73.1; 712/32; 712/245
(58) Field of Search ................................. 702/108, 117, 702/118, 57, 58, 59, 64, 69, 79, 80, 81, 82, 110, 120, 122, 123, 189, FOR 103, 104, 134, 135, 170, 171; 714/25, 29, 30, 31–33, 37, 47, 48, 733, 734, 738, 742, FOR 100, 101, 288, 299; 438/14, 17, 18; 324/73.1; 712/32, 33–43, 236, 245; 716/4, 18, FOR 489

(56) References Cited

U.S. PATENT DOCUMENTS 5,416,783 A * 5/1995 Broseghini et al. ........ 371/22.3
6,006,343 A * 12/1999 Whetsel ....................... 714/28

FOREIGN PATENT DOCUMENTS

JP 5-180903 7/1993
JP 5-257869 10/1993

OTHER PUBLICATIONS

Arnaud Hollinger et al., "The computer inside out: Memory", Feb. 16, 1999, Think Quest, http://www.thinkquest.org/25111/memeory.shtml.*

* cited by examiner

Primary Examiner—Marc S. Hoff
Assistant Examiner—Elias Desta
(74) Attorney, Agent, or Firm—Burns, Doane, Swecker & Mathis, LLP (57) ABSTRACT

A semiconductor integrated circuit with a IP test circuit having a IP test circuit, a IP6, a IP7, a COU 4, a SRAM 5. The IP test circuit has a IP test controller 21 including a register 21, a test sequencer 2, a selector 3, and a bus interface 11. Under the control of the IP test controller 1, a test program and test data in serial form are transferred from an external tester through a test data terminal 9 and then converted to the test program and the test data in parallel form. The converted test program and the test data are stored into the SRAM 5. The CPU 4 executes the test operation for the IP6 directly connected to a cpu bus 8. The test sequencer 7 executes the test operation for the IP7 that is not directly connected to the cpu bus 8. The test results are transferred to the external tester through the test data terminal.

7 Claims, 8 Drawing Sheets

| MODE 1 | MODE 2 | OPERATION |
|--------|--------|-----------|
| 0 | 0 | PROGRAM LOAD |
| 1 | 0 | CPU DRIVING |
| 0 | 1 | TEST SEQUENCER DRIVING |
| 1 | 1 | — |

FIG.5

| MODE 1 | OPERATION |
|--------|-----------|
| 0 | PROGRAM LOAD |
| 1 | CPU DRIVING |

FIG.7

| MODE 1 | OPERATION |
|--------|-----------|
| 0 | CPU DRIVING |
| 1 | TEST SEQUENCER DRIVING |

| MODE 1 | OPERATION |
|---|---|
| 0 | CPU DRIVING |
| 1 | — |

FIG.11

| MODE 1 | OPERATION |
|---|---|
| 0 | TEST SEQUENCER DRIVING |
| 1 | — |

FIG.10

SEMICONDUCTOR INTEGRATED CIRCUIT WITH IP TEST CIRCUIT

BACKGROUND OF THE INVENTION

1. Field of the Invention

The present invention relates to a semiconductor integrated circuit having an Intellectual property (IP) test circuit to be used for testing the operation of each Intellectual property core (hereinafter referred to as IP) such as logical blocks of USB and JPEG, a DRAM, and other logical blocks.

2. Description of the Related Art

Figure 1:
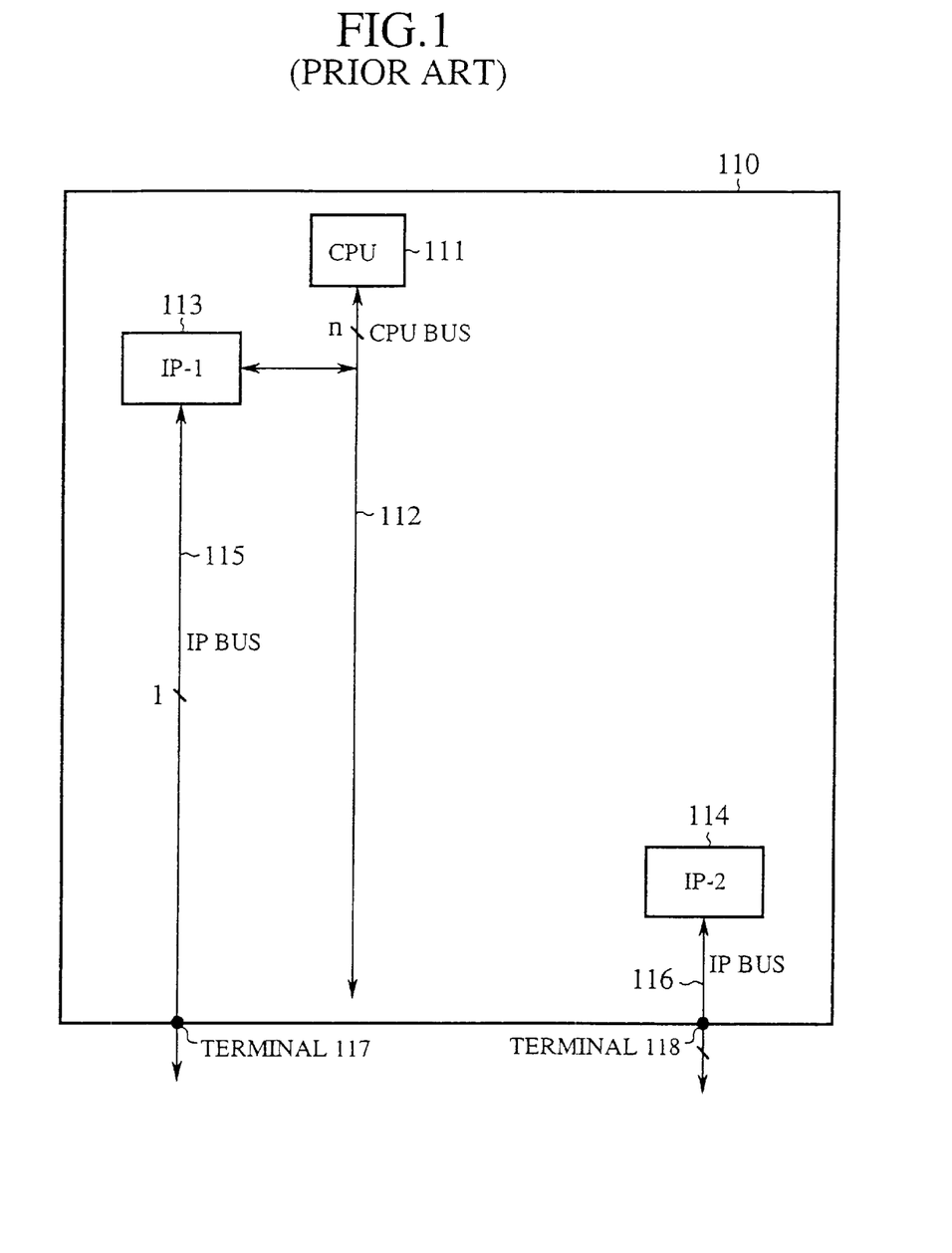
FIG. 1 is a block diagram showing a configuration of a conventional semiconductor integrated circuit having plural IP.

FIG. 1 is a block diagram showing a configuration of a conventional LSI with plural IP (IP-1 and IP-2). In FIG. 1, the reference numbers 113 and 114 designate IP-1 and IP-2, respectively such as logical blocks of a universal serial bus (USB) and JPEG, a DRAM, and so on. The reference number 111 denotes a CPU. The reference numbers 117 and 118 designate test control terminals. The reference number 110 designates a LSI on which the CPU 111, the IP 113, and the IP 114 are mounted.

In the configuration of the conventional semiconductor integrated circuit shown in FIG. 1, the IP 113 is directly connected to the CPU 111, and the IP 114 is not directly connected to the CPU 111. The IP 113 is connected to an external device (omitted from FIG. 1) through the test control terminal 117. The IP 114 is connected to an external device (omitted from FIG. 1) through the test control terminal 118.

Next, a description will be given of the operation of the conventional semiconductor integrated circuit with the IP shown in FIG. 1.

When the test operation of each IP mounted on the LSI shown in FIG. 1 is executed, the external device such as an external tester (not shown) outputs a test program and test data to the semiconductor integrated circuit (as a LSI) having a plurality of IP. After this, the test operation of each IP is executed in the LSI and then the LSI outputs test results of the test operation to the external tester through the test control terminals 117 and 118. In the configuration of the conventional semiconductor integrated circuit as a LSI, the test control terminals are formed per IP. Through the test control terminals 117 and 118 and the IP bus 115 and 116, test data and control signals to be used for testing each IP are transferred between each IP and the external tester.

Because the conventional semiconductor integrated circuit with plural IP has the configuration described above, it is required to form the test control terminal per IP. Accordingly, the conventional semiconductor integrated circuit has tens of test control terminals or hundreds of test control terminals. Because the number of the test control terminals is increased in proportion to the increasing of the number of the IP, the area to be used for the test control terminals is limited in the semiconductor integrated circuit when the test control terminals are formed on the semiconductor integrated circuit. Moreover, it is impossible to test a plurality of semiconductor integrated circuits simultaneously because of the limitation of the area and the number of the test control terminals. Furthermore, it must be required to use an external tester of more expensive when executing At-Speed test.

SUMMARY OF THE INVENTION

Accordingly, an object of the present invention is, with due consideration to the drawbacks of the conventional technique, to provide a semiconductor integrated circuit with a IP test circuit that is capable of decreasing the number of test control terminals. Furthermore, the semiconductor integrated circuit with the IP test circuit is capable of executing test operation for the plurality of IP simultaneously even if the semiconductor integrated circuit has the plurality of IP.

In accordance with a preferred embodiment of the present invention, a semiconductor integrated circuit with a IP test circuit comprises a plurality of Intellectual Properties (IP), memory means, a central processing unit (CPU), a test sequencer, and a control means. The memory means stores a test program and test data to be used for test operation of the plurality of IP. The CPU reads the test program and the test data stored in the memory means and executes test operation for the plurality of IP. The test sequencer executes test operation for the IP that is not directly connected to the CPU. The control means has a register and the control means instructs an execution of the test program to the CPU and instructs an execution of the test operation to the test sequencer when a mode value is set into the register.

In the semiconductor integrated circuit with the IP test circuit as another preferred embodiment of the present invention, the memory means is a Random Access Memory (ROM). The IP test circuit further comprises a selector and a bus interface. The selector connects the RAM to the test data terminal in order to read the test program and test data in serial form transferred from an external device through the test data terminal. The bus interface then converts the test program and the test data in serial form received through the test data terminal into the test program and test data in parallel form. In the semiconductor integrated circuit with the IP test circuit, the control means stores the test program and the test data into the RAM transferred through the test data terminal, the selector, and the bus interface from the external device when the mode value is set into the register, and transfers a control signal so that the CPU and the test sequencer execute the test operation for the plurality of IP, and outputs a test result to the external device through the test data terminal.

In the semiconductor integrated circuit with the IP test circuit as another preferred embodiment according to the present invention, the memory means is a Read Only Memory (ROM) in which the test program and the test data are stored beforehand.

In accordance with a preferred embodiment of the present invention, a semiconductor integrated circuit with a IP test circuit comprises a plurality of IP, a memory means, a CPU, a first bus interface, and a control means. The memory means stores a test program and test data to be used for test operation for the plurality of IP. The CPU reads the test program and the test data stored in the memory means and executes test operation for the plurality of IP. The first bus interface connects a cpu bus, that is directly connected to the CPU, to the IP in the plurality of IP that is not directly connected to the cpu bus. The control means having a register instructs to the CPU an execution of the test operation for both the IP directly connected to the CPU and the IP that is not directly connected to the CPU, and also instructs to the first bus controller an execution so that the cpu bus is connected to the IP that is not directly connected to the CPU when a mode value is set into the register.

In the semiconductor integrated circuit with the IP test circuit as another preferred embodiment according to the present invention, the memory means is a Random Access Memory (RAM). The IP test circuit further comprises a second bus interface for connecting the test data terminal to the RAM in order to receive the test program and the test data in serial form transferred from an external device through the test data terminal, and for converting them into the received test program and test data in parallel form, and for storing the test program and test data in parallel form into the RAM. In the semiconductor integrated circuit, the control means instructs the second bus interface so that the RAM is connected to the test data terminal in order to store the test program and the test data into the RAM, and instructs to the CPU an execution of the test operation for the plurality of IP, and transfers a test result to the external device through the test data terminal.

In the semiconductor integrated circuit with the IP test circuit as another preferred embodiment according to the present invention, the memory means is a Read Only Memory (ROM) in which the test program and the test data are stored beforehand.

In accordance with a preferred embodiment of the present invention, a semiconductor integrated circuit with a IP test circuit comprises a plurality of IP, a test sequencer, and control means. In the plurality of IP, one is connected to a Central Processing Unit (CPU), and another is not directly connected to the CPU. The test sequencer connected to each IP executes test operation for the plurality of IP. The control means having a register, instructs an execution of the test operation to the test sequencer when a mode value is set into the register. In the semiconductor integrated circuit, the test sequencer executes the test operation for the plurality of IP based on the instruction from the control means, and then outputs a test result to an external device through the test data terminal.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 2:
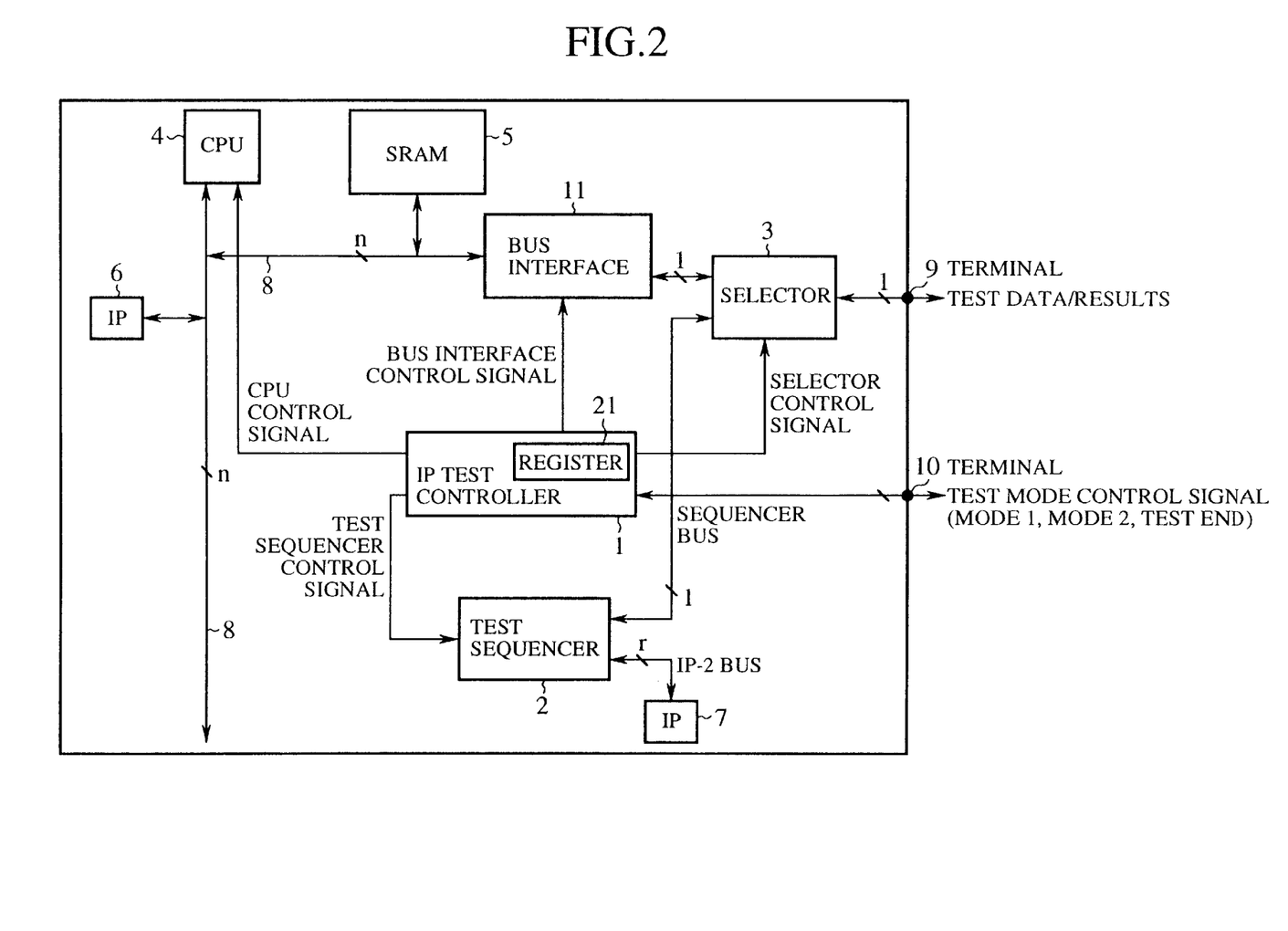
FIG. 2 is a block diagram showing a semiconductor integrated circuit with a IP test circuit as a LSI according to the first embodiment of the present invention.

FIG. 2 is a block diagram showing a semiconductor integrated circuit with a IP test circuit as a LSI according to the first embodiment of the present invention. In FIG. 2, the reference number 1 designates a IP test controller for executing a plurality of IP in the semiconductor integrated circuit. The IP test controller 1 incorporates a register 21. For example, an external tester (omitted from FIG. 2) generates and outputs a test mode control signal to the semiconductor integrated circuit. The register 21 stores a mode value based on the test mode control signal received. The IP test controller 1 reads the mode values Mode 1 and Mode 2 stored in the register 21 and controls IP test operation based on the mode values. The reference number 2 denotes a test sequencer for executing the IP test operation for IP that is not connected to a Central Processing Unit (CPU) 4. The reference number 3 indicates a selector. The CPU 4 executes a test program stored in a Static Random Access Memory (SRAM) 5 under the control of the IP test controller in order to perform the test of the IP that is directly connected to the cpu bus 8.

The reference number 5 designates the SRAM for storing the test program and test data. The reference numbers 6 and 7 denote intellectual property core (IP) such as logical blocks of universal serial bus and JPEG, a DRAM, and other logical blocks. The IP6 is directly connected to the CPU 4 through the cpu bus 8. On the other hand, the IP7 is not directly connected to the CPU 4. Only the IP6 and the IP7 are shown in the configuration of the semiconductor integrated circuit as the first embodiment shown in FIG. 2. However, the present invention including the first to fifth embodiments described below is not limited by this configuration. It is possible to apply the present invention to semiconductor integrated circuits including a plurality of IP more than two.

The reference number 8 designates the cpu bus through which the CPU 4, the IP6, the SRAM 5, the bus interface 11 are connected to each other. The reference number 9 designates a test data terminal through which the test program and test data in serial form transferred from the external tester (omitted from FIG. 2) as an external device are serially received during test operation for the IP6 and the IP7, and a GO/NG signal as test results outputted from the test sequencer 2 is transferred to the external tester. Thus, the selector 3 and the external tester are connected through the signal line of a bit.

The reference number 10 designates a test mode terminal comprising plural terminals such as a terminal for a mode signal 1 as a test mode control signal, a terminal for a mode signal 2, and a test completion terminal for a test completion signal. The mode signals as the test mode control signal are transferred to and set into the register 21 in the IP test controller 21 through the test mode terminal 10. In addition, the test completion signal is transferred to the external tester as the external device through the test completion terminal. The reference number 11 denotes a bus interface for receiving the test program and the test data as serial signals transferred from the selector 3. The bus interface 11 then converts the test program and the test data received to parallel signals, and transfers the parallel signals to the SRAM 5 through the cpu bus 8.

Next, a description will be given of the operation of the semiconductor integrated circuit with the IP test circuit shown in FIG. 2.

Figure 3:
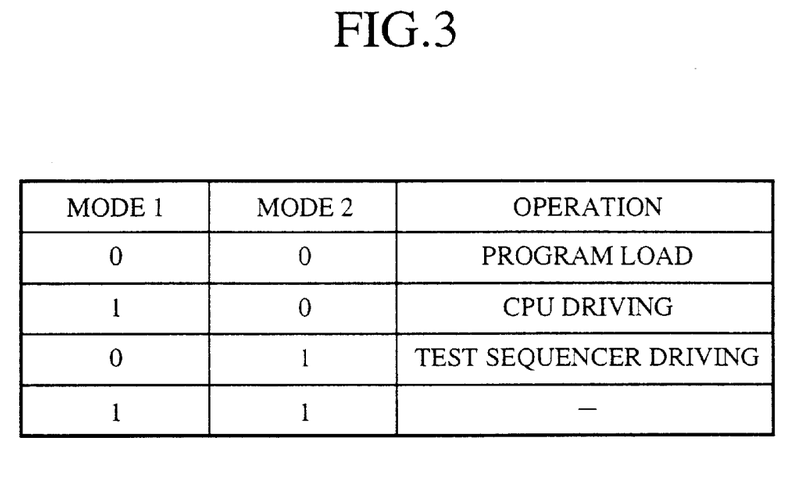
FIG. 3 is a diagram of a table showing a combination of mode values Mode 1, Mode 2 of test mode signals set in a register in a IP test controller in the semiconductor integrated circuit shown in FIG. 2.

FIG. 3 is a diagram of a table showing a combination of the mode values Mode 1 and Mode 2 of the test mode signals set in the register 21 in the IP test controller 1 in the semiconductor integrated circuit shown in FIG. 2.

In the test operation for the IP6 and the IP7, firstly, the test mode control signal is transferred from the external device such as the external tester (omitted from FIG. 2) to the register 21 in the IP test controller 1 through the test mode terminal 10. Thereby, the mode values Mode 1 and Mode 2 of the mode signals are set into the register 21 shown in FIG. 2 (mode setting operation). After the process described above, the IP test controller 1 reads the mode values Mode 1 and Mode 2 that have been set in the register 21. The IP test controller 1 then performs various test operations according to the combination of the mode values Mode 1 and Mode 2 that have been set in the register 21. After the completion of the test operation, the test end value is transferred to the external tester through the test completion terminal in the test mode terminal 10. The external device such as the external tester recognize the completion of the IP test operation when receiving the test completion signal transferred through the test completion terminal.

For example, in the case of the mode values Mode 1=0 and Mode 2=0, the IP test controller 1 generates a control signal and transfers it to both the selector 3 and the bus interface 11 in order to connect the cpu bus 8 to the test data terminal 9. Thereby, the bus interface 11 receives the test program and the test data of serial signals transferred from the external tester through the test data terminal 9 and the selector 3. The bus interface 11 then converts the received test program and test data in serial form into the test program and the test data in parallel form and transferred them to the SRAM 5 through the cpu bus 8. The SRAM 5 receives and stores the test program and the test data in parallel form (Test program writing operation).

After the mode values Mode 1 and Mode 2 are set (mode setting operation) into the register 21, the IP test controller 1 transfers the control signal to the CPU 4 so that the CPU 4 then initiates the execution of the test operation. The CPU 4 reads the test program and the test data stored in the SRAM 5, and then executes the test program for the IP 6 directly connected to the cpu bus 8.

When the mode values Mode 1=0 and Mode 2=1 are set into the register 21 (mode setting operation), the IP test controller 1 transfers the control signal to the test sequencer 2. The test sequencer 2 then initiates the execution of the test operation for the IP 7. Thereby, the test sequencer 2 executes the test operation for the IP 7 that is not directly connected to the COU bus 8 by using the test data to be obtained through the test data terminal 9.

After the completion of the test operation for the IP6 and the IP7, the IP controller 1 outputs a control signal indicating the completion of the test operation to the test completion terminal in the test mode terminal 10. The test sequencer 2 outputs a signal informing whether the test result is GO or NG to the test data terminal 9. The external device such as the external tester receives the signal through the test data terminal 9 and recognizes the completion of the test operation for the IP7 through the test completion terminal and obtains the test result through the test data terminal 9.

As described above, according to the first embodiment, the IP test controller 1 incorporated in the semiconductor integrated circuit controls the test operation of the CPU 4 and the test sequencer 2 for the IP 6 and IP 7 based on the mode values Mode 1 and Mode 2 set in the register 21. Then, the IP test controller 1 controls so that the CPU 4 executes the test program stored in the SRAM 5 in order to execute the test operation for the IP6 directly connected to the cpu bus 8. In addition, the IP test controller 1 also controls so that the test sequencer 2 executes the test program stored in the SRAM 5 in order to execute the test operation for the IP7 that is not directly connected to the cpu bus 8. The IP test controller 9 serially inputs the test program and the test data through the test data terminal 9 and also inputs the test mode control signal to control the operation of the IP test controller 1 through the test mode terminal 10. After the completion of the test operation, the IP test controller 1 outputs the test result to the external device such as the external tester. It is thereby possible to execute the test operation for all of the IP incorporated in the semiconductor integrated circuit only by one IP test controller 1. In addition to the above features of the first embodiment, it is also possible to greatly reduce the number of the test terminals required for the IP test. This causes to easily layout the test terminals to the semiconductor integrated circuit. Because the number of the test terminals is reduced, it is possible for the external tester to instruct that the test operation for plural IP incorporated in the semiconductor integrated circuit is executed simultaneously, and to judge the test results simultaneously. Furthermore, a tester having a simple function may be used as the external tester in order to execute the test operation for plural IP efficiently.

Second Embodiment

Figure 4:
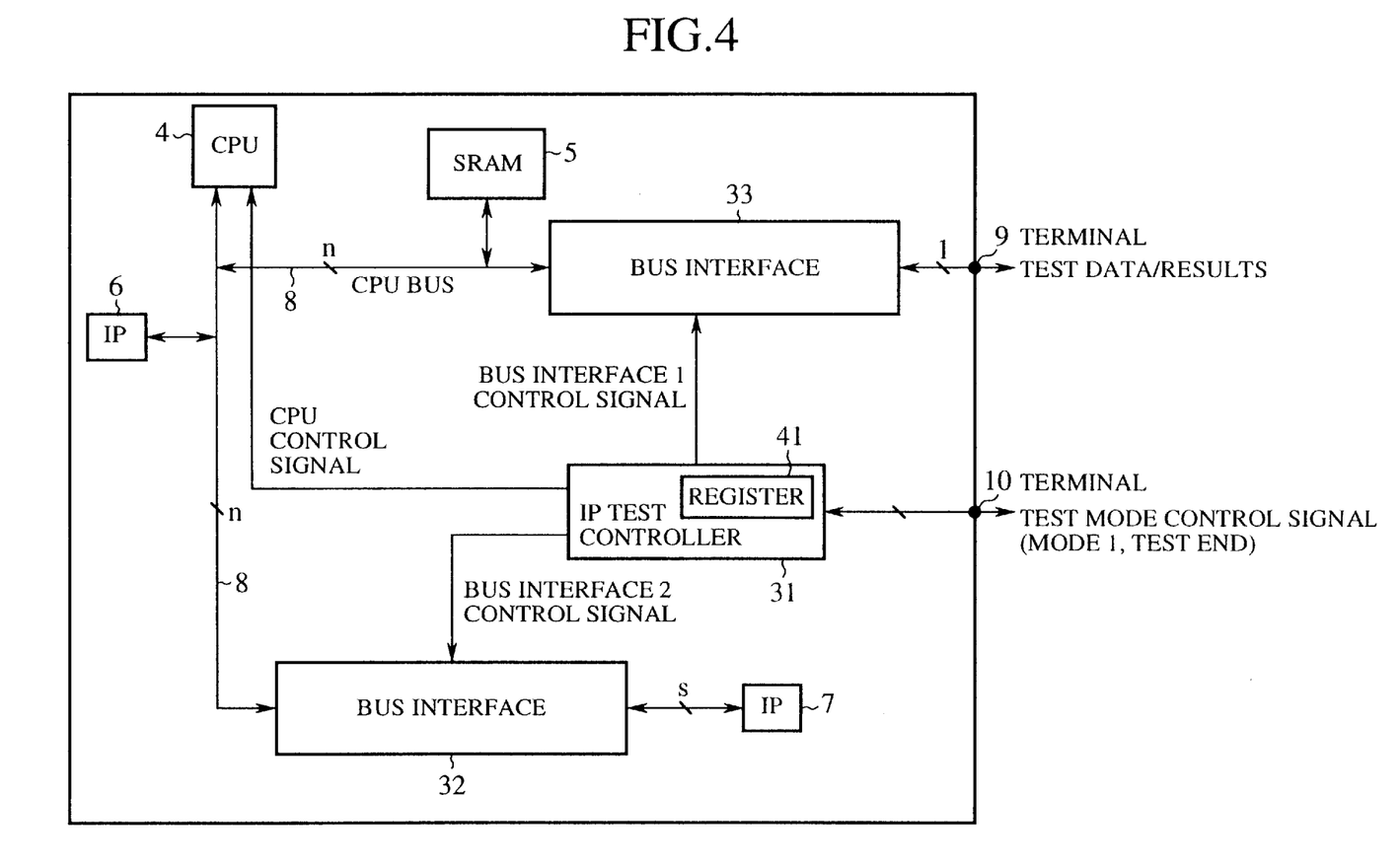
FIG. 4 is a block diagram showing a semiconductor integrated circuit with a IP test circuit as a LSI according to the second embodiment of the present invention.

FIG. 4 is a block diagram showing a semiconductor integrated circuit with a IP test circuit as a LSI according to the second embodiment of the present invention. In FIG. 4, the reference number 31 designates a IP test controller for executing test operation for plural IP. The IP test controller has a register 41. The IP test controller 31 controls the IP test operation based on mode values set in the register 41. The reference number 33 denotes a bus interface for receiving a test program and test data in serial form and converting them into the test program and test data in parallel form. The reference number 32 indicates a bus interface for receiving a control signal transferred from the IP test controller 31 and for switching a bus width between the cpu bus 8 and the bus connected to the IP7. Other components in the semiconductor integrated circuit of the second embodiment are the same as the components in the semiconductor integrated circuit of the first embodiment, therefore, the same reference numbers are used for the same components, and the explanation for them is omitted here.

Next, a description will be given of the operation of the semiconductor integrated circuit with the IP test circuit according to the second embodiment.

Figure 5:
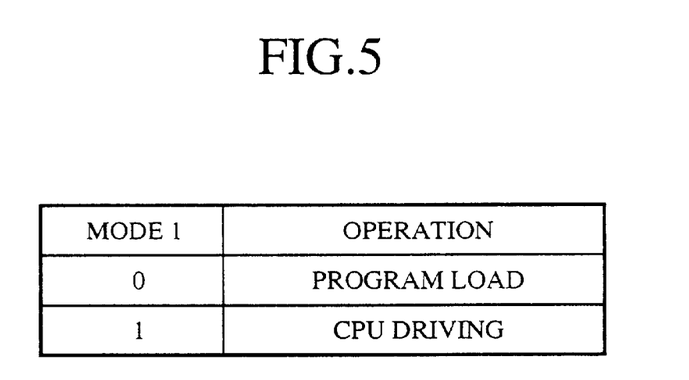
FIG. 5 is a diagram of a table showing a combination of a mode value Mode 1 of a test mode signal set in a register in a IP test controller in the semiconductor integrated circuit shown in FIG. 4.

FIG. 5 is a diagram showing a table of a combination of the mode value Mode 1 of the test mode signal set in the register 41 in the IP test controller 31 in the semiconductor integrated circuit shown in FIG. 4.

In the test operation for the IP6 and the IP7, firstly, the test mode control signal is transferred from an external device such as the external tester (omitted from FIG. 4) to the register 41 in the IP test controller 31 through the test mode terminal 10. Thereby, the mode value Mode 1=1 of the mode signal is set into the register 21 shown in FIG. 4 (mode setting operation). After this, the IP test controller 31 reads the mode value stored in the register 41 and controls various test operations based on the mode value Mode 1 shown in FIG. 5.

After the completion of the test operation, the test end value is transferred to the external tester through the test completion terminal in the test mode terminal 10. The external tester recognizes the completion of the IP test operation when receiving the test completion signal transferred through the test completion terminal.

Firstly, the external tester transfers the mode value Mode 1 to the resister 41 in the IP test controller 31 (mode setting operation). After this, the IP test controller 31 reads the mode value set in the register 41 and controls the test operation according to the mode value Mode 1 shown in FIG. 5. For example, in the case of the mode value Mode 1=1, the IP test controller 31 outputs the control signal to the bus interface 33 so that the cpu bus 8 is connected to the test data terminal 9. Thereby, the bus interface 33 receives the test program and the test data in serial form transferred from the external tester through the test data terminal 9, converts them into the test program and test data in parallel form, and then transferred the parallel signals to the SRAM 5 through the cpu bus 8. The SRAM 5 receives and stores the test program and the test data in parallel form (Test program writing operation).

Next, when the mode value Mode 1=1 is set into the register 41, the IP test controller 31 transfers the control signal to the CPU 4 in order that the CPU 4 initiates the execution of the test operation for the IP6 and the IP7.

Thereby, the CPU 4 reads the test program and the test data stored in the SRAM 5, and then executes the test program for the IP 6 directly connected to the cpu bus 8.

Further, the IP test controller 31 transfers the control signal to the CPU 4 and the bus interface 32 in order that the CPU 4 executes the test operation for the IP7 that is not directly connected to the IP7. When the bus width of the cpu bus 8 CPU is different from that of the bus directly connected to the IP7, the bus interface 32 performs the serial/parallel conversion and the parallel/serial conversion.

After the completion of the test operation for the IP6 and the IP7, the IP test controller 31 outputs a control signal indicating the completion of the test operation to the test completion terminal in the test mode terminal 10. The IP test controller 31 outputs a signal informing whether the test result is GO or NG to the test data terminal 9 through the bus interface 33. The external device such as the external tester receives the signal through the test data terminal 9 and recognizes the completion of the test operation through the test completion terminal and obtains the test result through the test data terminal 9.

As described above, according to the second embodiment, the IP test controller 31 incorporated in the semiconductor integrated circuit controls the test operation of the CPU 4, the bus interfaces 32 and 33. The CPU 4 executes the test program stored in the SRAM 5 in order to execute the test operation for the IP6 directly connected to the cpu bus 8 and the IP7 that is not directly connected to the cpu bus 8. In addition, the test program and the test data are serially received through the test data terminal 9, and the test mode control signals to be used for controlling the operation of the IP test controller 31 are received through the test mode terminal 10, and the test results is then outputted to the external device such as the external tester through the test data terminal 9. It is thereby possible to execute the test operation for all of the IP incorporated in the semiconductor integrated circuit only by one IP test controller 31. In addition to the above features of the second embodiment, it is also possible to greatly reduce the number of the test terminals required for the IP testing. This causes to easily layout the test terminals to the semiconductor integrated circuit. Because the number of the test terminals is reduced, it is possible for the external tester to instruct that the test operation for plural IP incorporated in the semiconductor integrated circuit is executed simultaneously, and to judge the test results simultaneously. Furthermore, a tester having a simple function may be used as the external tester in order to execute the test operation for plural IP efficiently.

Third Embodiment

Figure 6:
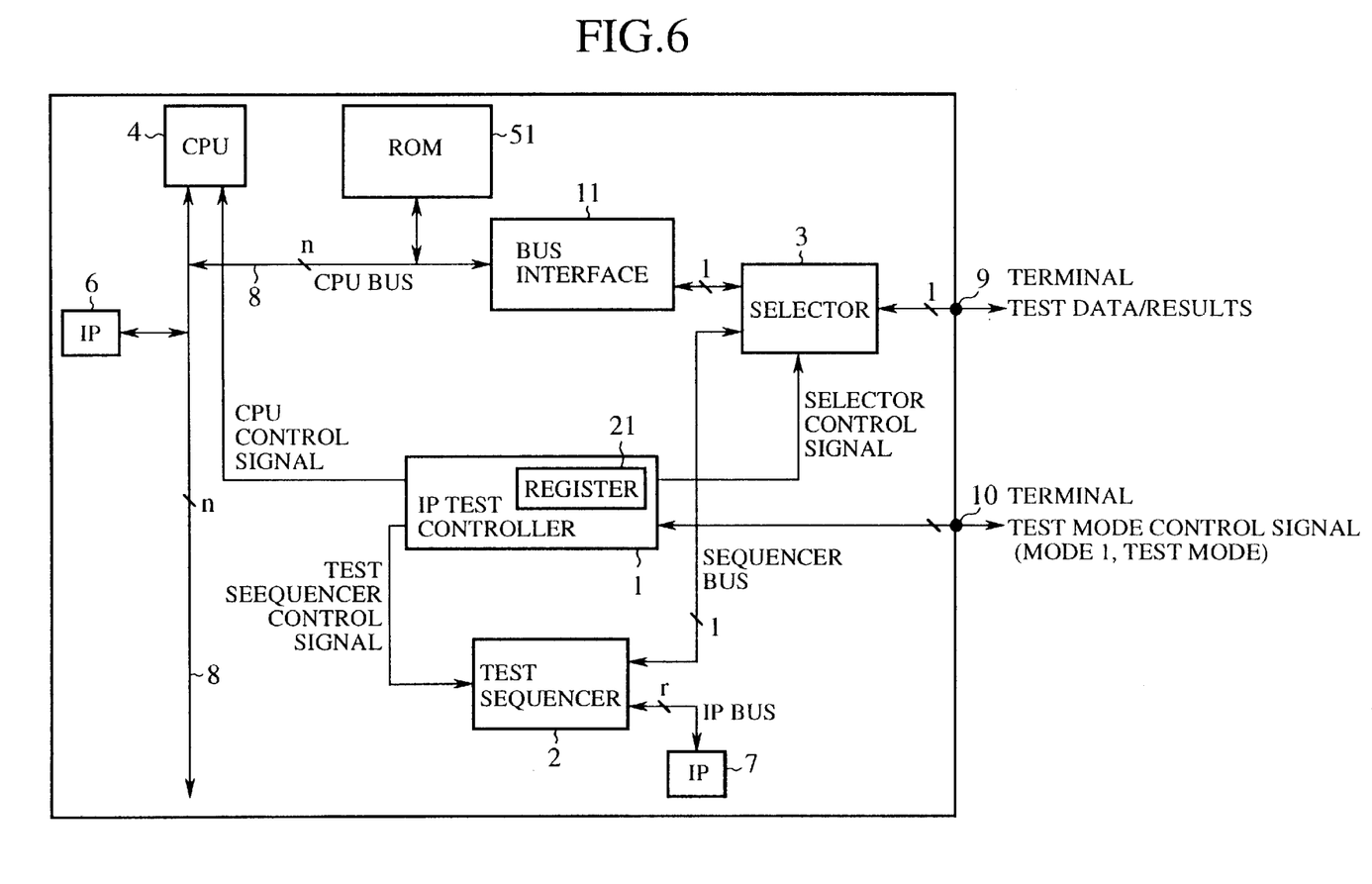
FIG. 6 is a block diagram showing a semiconductor integrated circuit with a IP test circuit as a LSI according to the third embodiment of the present invention.

FIG. 6 is a block diagram showing a semiconductor integrated circuit with a IP test circuit according to the third embodiment of the present invention. In FIG. 6, the reference number 51 designates a Read Only Memory (ROM) in which a test program and test data are stored beforehand. Other components in the semiconductor integrated circuit of the third embodiment are the same as the components in the semiconductor integrated circuit of the first embodiment, therefore, the same reference numbers are used for the same components, and the explanation for them is omitted here.

Next, a description will be given of the operation of the semiconductor integrated circuit with the IP test circuit according to the third embodiment.

Figure 7:
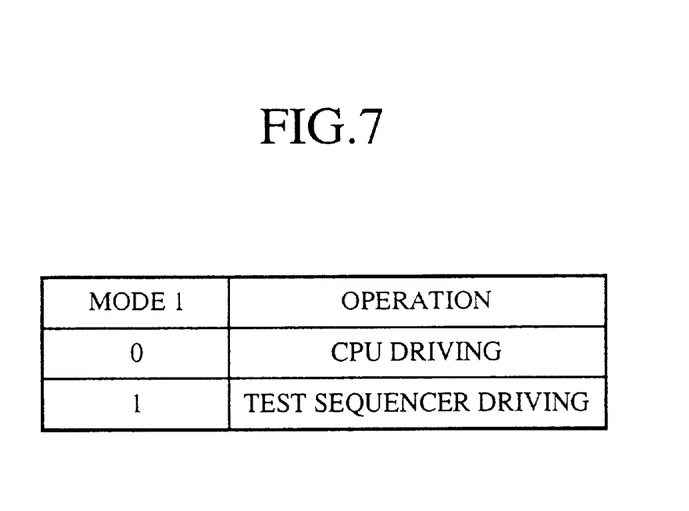
FIG. 7 is a diagram of a table showing a combination of a mode value Mode 1 of a test mode signal set in a register in a IP test controller in the semiconductor integrated circuit shown in FIG. 6.

FIG. 7 is a diagram of a table showing a combination of the mode value Mode 1 of the test mode signal set in the register 21 in the IP test controller 21 in the semiconductor integrated circuit shown in FIG. 6.

In the semiconductor integrated circuit with the IP test circuit as the first embodiment shown in FIGS. 2 and 3, the external tester transfers and sets the mode values Mode 1 and Mode 2 of the mode signals into the register 21 in the IP test controller 1 through the test mode terminal 10, and the test program is loaded into the SRAM 5.

In the semiconductor integrated circuit with the IP test circuit according to the third embodiment, the test program and the test data are stored in the ROM 51 in advance. Accordingly, only the mode value Mode 1 is received and stored in the register 21.

For example, when the mode value Mode 1=0 is set in the register 21 by the external tester, the IP test controller 1 drives the CPU 4 in order to execute the program stored in the ROM 51. The CPU performs the test operation for the IP6 directly connected to the cpu bus 8.

On the other hand, when the mode value Mode 1=1 from the external tester is received and then set in the register 21, the IP test controller 1 drives the test sequencer 2 so that the test sequencer 2 executes the test operation for the IP7 that is not directly connected to the cpu bus 8. The test operation by the CPU 4 and the test sequencer 2 under the control of the IP test controller 1 is the same as that of the test operation in the first embodiment, the explanation for them is therefore omitted here.

As described above, according to the third embodiment, only the IP test controller 1 incorporated in the semiconductor integrated circuit controls the test operation for all of the IP in the semiconductor integrated circuit. In addition, it is also possible to greatly reduce the number of the test terminals required for the IP testing. This causes to easily layout the test terminals to the semiconductor integrated circuit. Because the number of the test, terminals is reduced, it is possible for the external tester to instruct that the test operation for plural IP incorporated in the semiconductor integrated circuit is executed simultaneously, and to judge the test results simultaneously. In addition to the above features, because the test program and the test data are stored in the ROM 51 beforehand, it is possible to eliminate the loading of the test program and the program data and to execute the test operation at high speed. Further, it is also possible to use a tester having a simple function as the external tester in order to execute the test operation for plural IP efficiently.

Fourth Embodiment

Figure 8:
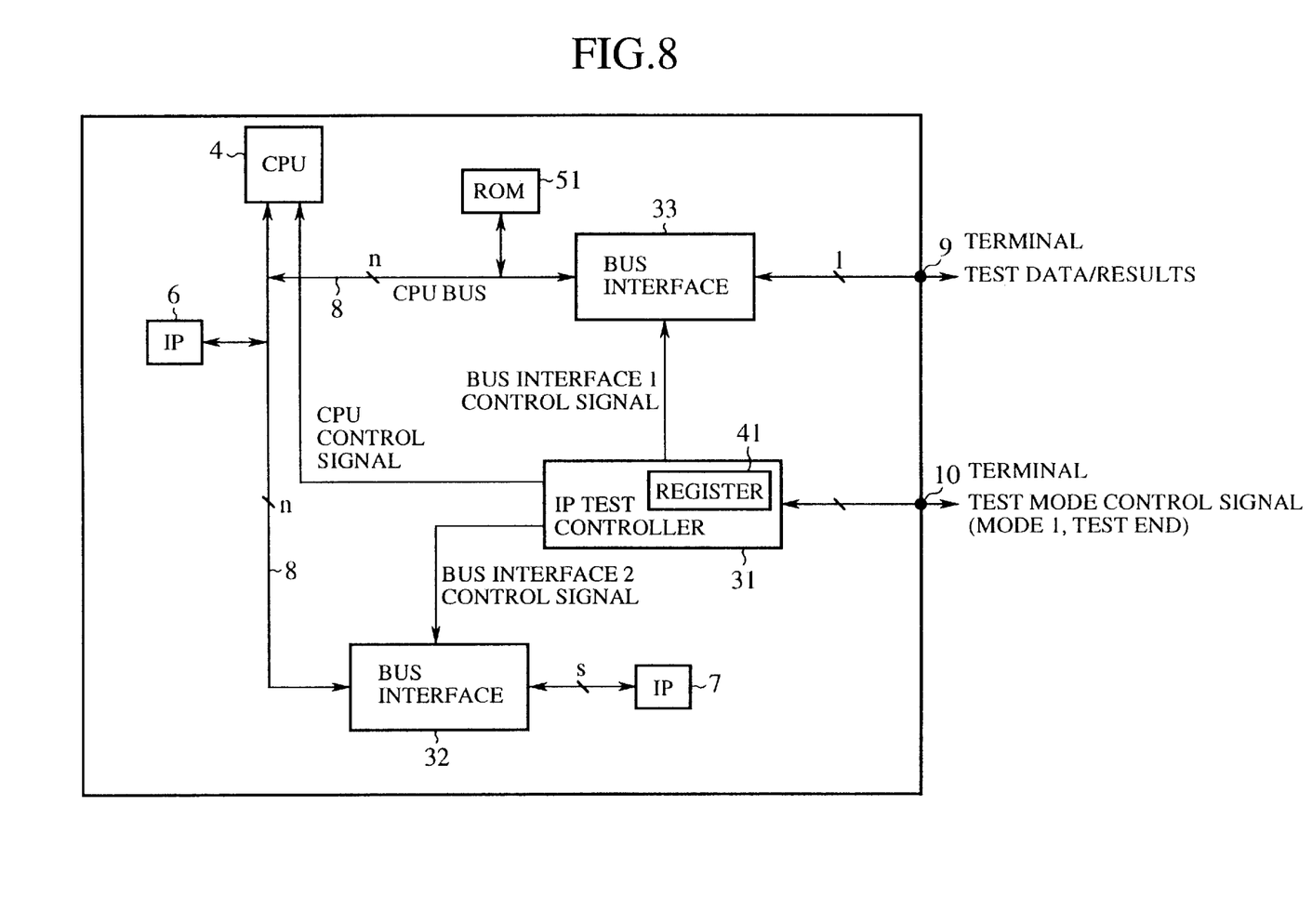
FIG. 8 is a block diagram showing a semiconductor integrated circuit with a IP test circuit as a LSI according to the fourth embodiment of the present invention.

FIG. 8 is a block diagram showing the semiconductor integrated circuit with the IP test circuit according to the fourth embodiment of the present invention. In FIG. 8, the reference number 51 designates a ROM in which the test program and the test data are stored beforehand. Other components in the semiconductor integrated circuit of the fourth embodiment are the same as the components in the semiconductor integrated circuit of the second embodiment shown in FIGS. 4 and 5, therefore, the same reference numbers are used for the same components, and the explanation for them is omitted here.

Next, a description will be given of the operation of the semiconductor integrated circuit with the IP test circuit according to the fourth embodiment.

Figure 9:
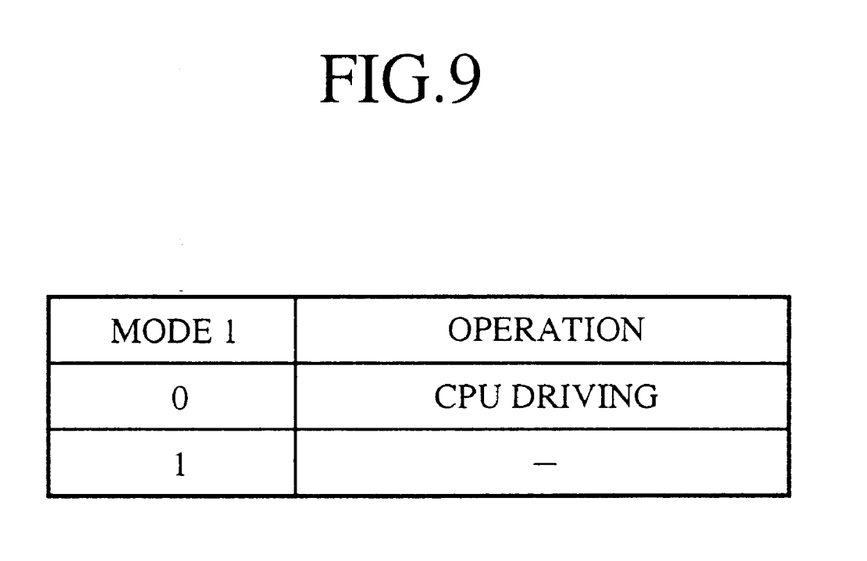
FIG. 9 is a diagram of a table showing a combination of a mode value Mode 1 of a test mode signal set in a register in a IP test controller in the semiconductor integrated circuit shown in FIG. 8.

FIG. 9 is a diagram of a table showing a combination of the mode value Mode 1 of the test mode signal set in the register 41 in the IP test controller 21 in the semiconductor integrated circuit shown in FIG. 6.

In the semiconductor integrated circuit with the IP test circuit as the second embodiment shown in FIGS. 4 and 5, the external tester transfers and sets the mode value Mode 1 of the mode signal into the register 41 in the IP test controller 31 through the test mode terminal 10, and the test program is loaded into the SRAM 5. In the semiconductor integrated circuit with the IP test circuit according to the fourth embodiment, the test program and the test data are stored in the ROM 51 in advance. Accordingly, only the mode value Mode 1=0 is stored in the register 41 so that the CPU 4 performs the test operation for the IP6 and the IP7.

For example, when the mode value Mode 1=0 is set in the register 21 by the external tester, the IP test controller 31 drives the CPU 4 in order to execute the program stored in the ROM 51. The CPU 4 performs the test operation for the IP6 directly connected to the cpu bus 8 and the test operation for the IP7 that is not directly connected to the cpu bus 8. The test operation by the CPU 4 is the same as that of the test operation in the second embodiment, the explanation for them is therefore omitted here.

As described above, according to the fourth embodiment, only the IP test controller 1 controls the test operation for all of the IP incorporated in the semiconductor integrated circuit. In addition, it is also possible to greatly reduce the number of the test terminals required for the IP testing. This causes to easily layout the test terminals to the semiconductor integrated circuit. Because the number of the test terminals is reduced, it is possible for the external tester to instruct that the test operation for plural IP incorporated in the semiconductor integrated circuit is executed simultaneously, and to judge the test results simultaneously. In addition to the above features, because the test program and the test data are stored in the ROM 51 beforehand, it is possible to eliminate the loading of the test program and the program data and to execute the test operation at high speed. Further, it is also possible to use a tester having a simple function as the external tester in order to execute the test operation for plural IP efficiently.

Fifth Embodiment

Figure 10:
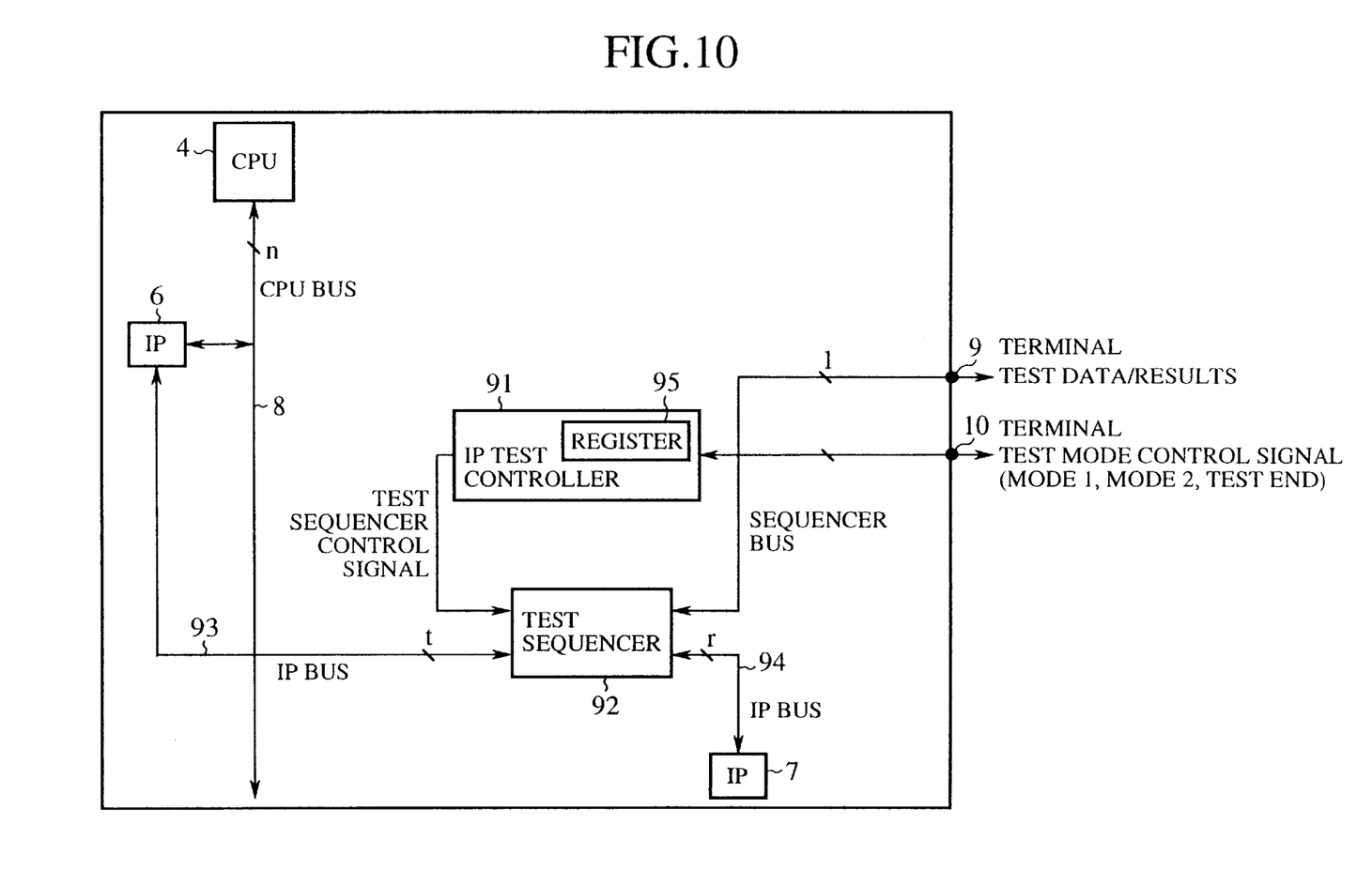
FIG. 10 is a block diagram showing a semiconductor integrated circuit with a IP test circuit as a LSI according to the fifth embodiment of the present invention.

FIG. 10 is a block diagram showing a semiconductor integrated circuit with the IP test circuit according to the fifth embodiment of the present invention. The reference number 91 designates a IP test controller for executing the test operation for plural IP incorporated in the semiconductor integrated circuit. The IP test controller 91 includes the register 95 therein. The IP test controller 91 initiates the execution of the test operation by setting a mode value Mode 1 into the register 95 after the external tester as the external device transfers the test mode signal to the IP test controller 91. The reference number 92 designates the test sequencer for executing the test operation for the IP7. The reference number 4 denotes the CPU.

The reference numbers 6 and 7 designate intellectual property core (IP) such as logical blocks of universal serial bus and JPEG, a DRAM, and other logical blocks. The IP6 is directly connected to the CPU 4 through the cpu bus 8. On the other hand, the IP7 is not directly connected to the CPU 4. Only the IP6 and the IP7 are shown in the configuration of the semiconductor integrated circuit as the fifth embodiment shown in FIG. 10. However, the present invention is not limited by this configuration. It is possible to apply the present invention to semiconductor integrated circuits including a plurality of IP more than two. The reference number 8 designates the cpu bus connecting the CPU 4. The reference numbers 93 and 94 denote IP buses directly connected to the IP6 and IP7. The reference number 9 designates a test data terminal through which the test program and test data are serially transferred from the external tester (not shown) to the test sequencer 92 during test operation for the IP6 and the IP7, and a GO/NG signal indicating test results outputted from the test sequencer 2 are transferred to the external tester. Thus, the test sequencer 92 and the external tester as the external device are connected through the signal line of a bit.

The reference number 10 designates a test mode terminal comprising plural terminals such as a terminal for a mode signal 1 as a test mode control signal, a terminal for a mode signal 2, and a test completion terminal for a test completion signal. The mode signals as the test mode control signals are transferred to and set into the register 95 in the IP test controller 91 through the test mode terminal 10. In addition, the test completion signal is transferred to the external tester as the external device through the test completion terminal.

Next, a description will be given of the operation of the semiconductor integrated circuit with the IP test circuit shown in FIG. 10.

Figure 11:
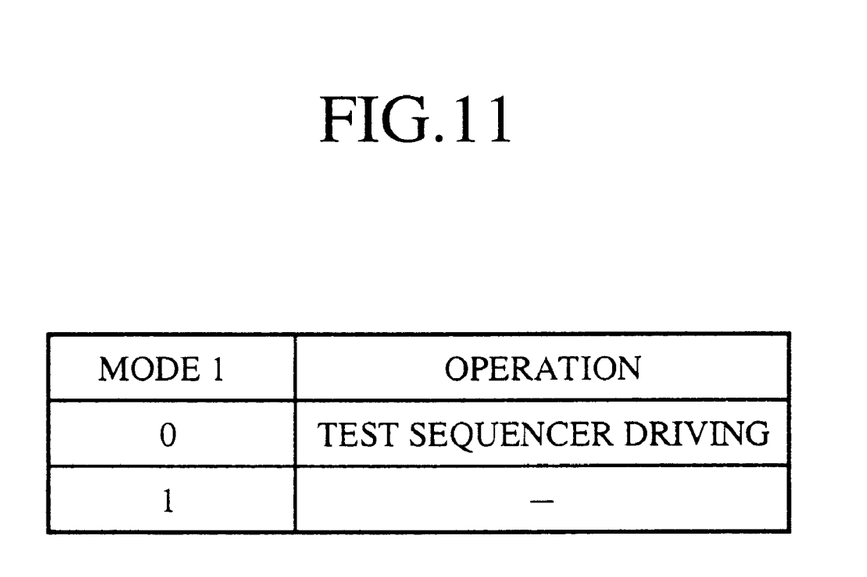
FIG. 11 is a diagram of a table showing a combination of a mode value Mode 1 of a test mode signal set in a register in a IP test controller in the semiconductor integrated circuit shown in FIG. 10.

FIG. 11 is a diagram of a table showing a combination of the mode value Mode 1 of the test mode signal set in the register 95 in the IP test controller 91 in the semiconductor integrated circuit shown in FIG. 10.

In the test operation for the IP6 and the IP7, firstly, the test mode control signal is transferred from the external device such as the external tester (omitted from FIG. 10) to the register 95 in the IP test controller 91 through the test mode terminal 10. Thereby, the mode value Mode 1 of the mode signal is set into the register shown in FIG. 11 (mode setting operation). After the completion of the test operation, the test end value is transferred to the external tester through the test completion terminal in the test mode terminal 10. The external device such as the external tester recognize the completion of the IP test operation when receiving the test completion signal transferred through the test completion terminal.

For example, in a case of Mode 1=0, the IP test controller 91 outputs the control signal to the test sequencer 92 so that the test sequencer 92 initiates the execution of the test operation for the IP6 and the IP7. When receiving the control signal transferred from the IP test controller 91, the test sequencer 92 connects the IP bus 93 and the IP bus 94 and the test data terminal 9 in order to input the test data through the test data terminal 9. Thereby, the test sequencer 92 executes the test operation.

When the test operation for the IP 6 and the IP 7 is completed, the IP test controller 91 outputs the control signal informing the completion of the test operation to the test completion terminal in the test mode terminal 10. The test sequencer 92 outputs the signal informing whether the test result is GO or NG to the test date terminal 9.

The external device such as the external tester receives the signal through the test data terminal 9 and recognizes the completion of the test operation for the IP6 and the IP7 through the test completion terminal and obtains the test result through the test data terminal 9.

As described above, according to the fifth embodiment, the IP test controller 91 incorporated in the semiconductor integrated circuit controls the operation of the test sequencer 92. The test sequencer 92 executes the test operation for the IP 6 directly connected to the cpu bus 8 and IP 7 that is not directly connected to the cpu bus 8. The test sequencer 92 inputs the test data through the test data terminal 9 and also outputs the test result to the external tester through the test data terminal 9. The IP test controller 91 inputs the test mode signals to control the operation of the IP test controller 91 through the test mode terminal 10. It is thereby possible to execute the test operation for all of the IP incorporated in the semiconductor integrated circuit only by one IP test controller 91. In addition to the above features, it is also possible to greatly reduce the number of the test terminals required for the IP testing. This causes to easily layout the test terminals to the semiconductor integrated circuit. Because the number of the test terminals is reduced, it is possible for the external tester to instruct that the test operation for plural IP incorporated in the semiconductor integrated circuit is executed simultaneously, and to judge the test results simultaneously. Furthermore, a tester having a simple function may be used as the external tester in order to execute the test operation for plural IP efficiently.

As described above, according to the present invention, the IP test controller in the IP test circuit incorporated in the semiconductor integrated circuit controls the operation of the CPU and the test sequencer based on the mode values set in the register incorporated in the IP test controller. The CPU executes the test operation for the IP that is directly connected to the cpu bus, and the test controller performs the test operation for the IP that is not directly connected to the cpu bus. Further, the IP test circuit receives the test mode signals by which the operation of the IP test controller is controlled. The IP test circuit serially receives the test program and the test data in serial form transferred from the external tester and outputs the test result to the external tester through the test data terminal. It is therefore possible to execute the test operation for all of the IP incorporated in the semiconductor integrated circuit by the CPU and the test sequencer or only by one CPU under the control of one IP test controller 1. In addition, it is also possible to greatly reduce the number of the test terminals required for the IP testing. This causes to easily layout the test terminals to the semiconductor integrated circuit. Because the number of the test terminals can be reduced, it is possible for the external tester to instruct that the test operation for plural IP incorporated in the semiconductor integrated circuit is executed simultaneously, and to judge the test results simultaneously. Furthermore, a tester having a simple function may be used as the external tester in order to execute the test operation for plural IP efficiently.

Furthermore, according to the present invention, because the test program and the test data are stored in the ROM beforehand, it is not required to load them from the external device such as the external tester. Accordingly, it is possible to execute the test operation for IP at high speed. Furthermore, a tester having a simple function may be used as the external tester in order to execute the test operation for plural IP efficiently.

Moreover, according to the present invention, the IP test controller in the IP test circuit incorporated in the semiconductor integrated circuit controls the operation of the test sequencer. The test sequencer executes the test operation for the IP that is directly connected to the cpu bus and the IP that is not directly connected to the cpu bus. Further, the IP test circuit receives the test mode signals, through the test mode terminal, by which the operation of the IP test controller is controlled. The IP test circuit also receives serially the test data in serial form from the external tester, and outputs the test result to the external tester through the test data terminal. It is therefore possible for the test sequencer to execute the test operation for all of the IP incorporated in the semiconductor integrated circuit under the control of one IP test controller 1. In addition, it is also possible to greatly reduce the number of the test terminals required for the IP testing. This causes to easily layout the test terminals to the semiconductor integrated circuit. Because the number of the test terminals can be reduced, it is possible for the external tester to instruct that the test operation for plural IP incorporated in the semiconductor integrated circuit is executed simultaneously, and to judge the test results simultaneously. Furthermore, a tester having a simple function may be used as the external tester in order to execute the test operation for plural IP efficiently.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit with an Intellectual Properties (IP) test circuit, comprising:
 a plurality of IP;
 memory means for storing a test program and test data to be used for test operation of one of said plurality of IP;
 a central processing unit (CPU) for reading said test program and said test data stored in said memory means and for executing test operation for the one of said plurality of IP which is electrically connected to said CPU through a CPU bus;
 a test sequencer for executing test operation for said IP that is working without direct control of said CPU; and
 control means having a register, for instructing an execution of said test program to said CPU and instructing an execution of said test operation to said test sequencer when a mode value is set into said register.

2. The semiconductor integrated circuit with a IP test circuit according to claim 1, wherein said memory means is a Random Access Memory (RAM),
 said IP test circuit further comprises a selector for connecting said RAM to a test data terminal in order to read said test program and test data in serial form transferred from an external device through said test data terminal, and a bus interface for converting said test program and said test data in serial form received through said test data terminal into said test program and said test data in parallel form, wherein said control means stores said test program and said test data into said RAM transferred through said test data terminal, said selector, and said bus interface from said external device when said mode value is set into said register, and transfers a control signal so that said CPU and said test sequencer execute said test operation for said plurality of IP, and outputs a test result to said external device through said test data terminal.

3. A semiconductor integrated circuit with a IP test circuit according to claim 1, wherein said memory means is a Read Only Memory (ROM) in which said test program and said test data are stored beforehand.

4. A semiconductor integrated circuit with an Intellectual Properties (IP) test circuit, comprising:

a plurality of IP;

memory means for storing a test program and test data to be used for test operation for one of said plurality of IP;

a central processing unit (CPU) for reading said test program and said test data stored in said memory means and for executing test operation for the one of said plurality of IP;

a first bus interface for connecting a CPU bus, which is directly electrically connected to said CPU, to another of said IP in said plurality of IP that is working without direct control of said CPU; and control means having a register, for instructing said CPU as to an execution of said test operation for both said IP directly connected to said CPU and said IP that is not directly connected to said CPU, and also instructing to said first bus controller an execution so that said CPU bus is connected to said IP that is not directly connected to said CPU when a mode value is set into said register.

5. A semiconductor integrated circuit with a IP test circuit according to claim 4, wherein said memory means is a Random Access Memory (RAM), said IP test circuit further comprises a second bus interface for connecting said test data terminal to said RAM in order to receive said test program and said test data in serial form transferred from an external device through said test data terminal, and for converting said received test program and said received test data into said test program and said test data in parallel form, and for storing said test program and test data in parallel form into said RAM, wherein said control means instructs said second bus interface so that said RAM is connected to said test data terminal in order to store said test program and said test data into said RAM, and instructs to said CPU an execution of said test operation for said plurality of IP, and transfers a test result to said external device through said test data terminal.

6. A semiconductor integrated circuit with a IP test circuit according to claim 4, wherein said memory means is a Read Only Memory (ROM) in which said test program and said test data are stored beforehand.

7. A semiconductor integrated circuit with a IP test circuit comprising:

a plurality of Intellectual Properties (IP), one connected to a Central Processing Unit (CPU), and another not directly connected to said CPU;

a test sequencer connected to each IP, for executing test operation for said plurality of IP; and control means having a register, for instructing an execution of said test operation to said test sequencer when a mode value is set into said register, wherein said test sequencer executes said test operation for said plurality of IP based on said instruction from said control means, and then outputs a test result to an external device through said test data terminal.

* * * * *